US008368673B2

(12) United States Patent
Tsai et al.

(10) Patent No.: US 8,368,673 B2
(45) Date of Patent: Feb. 5, 2013

(54) OUTPUT BUFFER AND SOURCE DRIVER USING THE SAME

(75) Inventors: Chien-Hung Tsai, Tainan (TW); Jia-Hui Wang, Tainan (TW); Ching-Chung Lee, Tainan County (TW)

(73) Assignees: Himax Technologies Limited, Tainan (TW); NCKU Research & Development Foundation, Tainan (TW)

( * ) Notice: Subject to any disclaimer, the term of this patent is extended or adjusted under 35 U.S.C. 154(b) by 1163 days.

(21) Appl. No.: 12/241,367

(22) Filed: Sep. 30, 2008

(65) Prior Publication Data

US 2010/0079431 A1 Apr. 1, 2010

(51) Int. Cl.
*G09G 5/00* (2006.01)
*H03F 3/45* (2006.01)

(52) U.S. Cl. ......... 345/204; 345/211; 330/259; 330/260

(58) Field of Classification Search .................. 345/211; 330/259, 260
See application file for complete search history.

(56) References Cited

U.S. PATENT DOCUMENTS 4,667,165 A * 5/1987 De Weck ...................... 330/253
5,864,254 A * 1/1999 Tashiro ......................... 327/319
2002/0084840 A1* 7/2002 Tsuchi .......................... 327/563
2002/0180685 A1* 12/2002 Itakura et al. ................. 345/100
2003/0160749 A1* 8/2003 Tsuchi ............................ 345/87
2004/0104873 A1* 6/2004 Kang et al. ....................... 345/87
2008/0100380 A1* 5/2008 Nishimura et al. ........... 330/252

FOREIGN PATENT DOCUMENTS

CN 101170299 4/2008

OTHER PUBLICATIONS

"First Office Action of China Counterpart Application", issued on Aug. 2, 2011, p. 1-p. 4.

* cited by examiner

*Primary Examiner* — Dorothy Harris
(74) *Attorney, Agent, or Firm* — J.C. Patents

(57) ABSTRACT

An output buffer and a source driver for a display panel are provided. The output buffer includes a differential input stage, a bias current source, a feedback module, and an output stage. The differential input stage has a first input terminal and a second input terminal receiving a first input signal and a second input signal respectively, and a first output terminal. The bias module provides a bias current to the differential input stage. The output stage has a second output terminal coupled to the first input terminal for providing an output current to the second output terminal based on a signal of the first output terminal. The feedback module adjusts the bias current and the output current based on the first input signal and the second input signal. The output buffer has ability of switching the output voltage to be low level and high level in high-speed.

11 Claims, 6 Drawing Sheets

OUTPUT BUFFER AND SOURCE DRIVER USING THE SAME

BACKGROUND OF THE INVENTION

1. Field of the Invention

The present invention relates to an output buffer and a source driver using the same, and more particularly, to the output buffer enhancing the speeds of switching an output voltage of the output buffer to be low level and high level.

2. Description of Related Art

The source driver is an important component in the driving system of the display device, which is used for converting a digital video signal to a driving voltage and providing the driving voltage to a pixel electrode in association with a certain enabled scan line. The driving voltages provided to the pixel electrode are not as good as expected because of the panel loading effect and the process variation so that the source driver utilizes the output buffers to enhance the driving abilities of its driving channels.

FIG. 1A is a circuit diagram of a conventional output buffer. Referring to FIG. 1, the output buffer 100*a* includes the transistors Mn1 through Mn7, wherein the transistors Mn1, Mn2, Mn3, and Mn6 are N-type transistors and the transistors Mn4, Mn5, and Mn7 are P-type transistors. The output buffer 100*a* applied to the source driver is a unity gain output buffer so that the output terminal Vout1 of the output buffer 100*a* may be coupled to the input terminal Vn−. An N-type differential input pair is composed of the transistors Mn2 and Mn3. The transistor Mn1 serves as a current source properly biased by the bias voltage Vb1. The currents In2 flowing through the transistor Mn2 is determined by the input signal at the input terminal Vn−, while the current In3 flowing through the transistor Mn3 is determined by the input signal at the input terminal Vn+.

If the signal of the input terminal Vn+is greater than the signal of the input terminal Vn−, the current In3 is greater than the current In2 so that the voltage of the first source/drain D3 of the transistor Mn3 may be decreased to conduct the transistor Mn7. The output buffer 100*a* develops a charging path from the power voltage VDD, to the output terminal Vout1 through the conducted transistor Mn7, so as to increase the voltage of output terminal Vout1. If the signal of the input terminal Vn+is less than the signal of the input terminal Vn−, the current In3 is less than the current In2 so that the voltage of the first source/drain D3 of the transistor Mn3 may be increased to make the transistor Mn7 not conduct. The transistor Mn6 is biased by the bias voltage Vb1, and develops a discharging path for decreasing the voltage of the output terminal Vout1. However, the bias voltage Vb1 is a fixed voltage so that the discharging current flowing through the conducted transistor Mn6 is restricted. This kind of output buffer 100*a* has better charging ability, but its discharging ability is limited. In other words, the speed of an output voltage of the output buffer 100*a* changing from high level to low level is slower than that changing from low level to high level.

FIG. 1B is another circuit diagram of a conventional output buffer. Referring to FIG. 1B, the output buffer 100*b* includes the transistors Mp1 through Mp7, wherein the transistor Mp1, Mp2, Mp3, and Mp7 are P-type transistors and the transistors Mp4, Mp5, and Mp6 are N-type transistors. The transistor Mp1 serves as a current source based on the bias voltage Vb2. The current Ip2 is determined by the signals of the input terminal Vp−, while the current Ip3 is determined by the signal of the input terminal Vp+. When the signal of the input terminal Vp+ is less than the signal of the input terminal Vp−, the current Ip3 is increased to conduct the transistor Mp6, so as to develop a discharge path to pull low the voltage at the output terminal Vout2. Besides, when the signal of the input terminal Vp+ is greater than the signal of the input terminal Vp−, the current Ip3 is decreased to make the transistor Mp6 not conduct, and the transistor Mp7, which is conducted by the bias voltage Vb2, develops a charging path. However, this kind of output buffer 100*b* has better discharging ability, but its charging ability is limited since the bias voltage Vb2 is a fixed voltage. As compared with the output buffer 100*a* in FIG. 1A, the speed of an output voltage of the output buffer 100*b* changing from low level to high low level is slower than that changing from high level to low level.

Therefore it is necessary to develop an output buffer with good charging and discharging ability.

SUMMARY OF THE INVENTION

The present invention provides an output buffer that can quickly enhance the signal for driving by increasing the speeds of switching the output voltage to be low level and high level. Besides, the source driver using the output buffers can perform polarity inversion on the display panel for saving the power consumption.

An output buffer is provided in the present invention. The output buffer includes a differential input stage, a bias current source, a feedback source, and an output stage. The differential input stage has a first input terminal receiving a first input signal, a second input terminal receiving a second input signal, and a first output terminal. The bias current source is coupled to the differential input stage for providing a bias current to the differential input stage. The output stage has a second output terminal coupled to the first input terminal. The output stage provides an output current via the second output terminal based on a signal of the first output terminal. The feedback module is coupled between the differential input stage and the output stage for adjusting the bias current and the output current based on the first input signal and the second input signal.

In the foregoing output buffer, a first current and a second current are respectively induced in the differential input stage based on the first input signal and the second input signal. A sum of the first current and the second current is equal to the bias current. The feedback module adjusts the bias current and the output current based on the first current.

In the foregoing output buffer, the feedback module includes a first mirror transistor for mirroring the first current to generate a reference current. The bias current source includes a second mirror transistor for mirroring the reference current to adjust the bias current. The output stage includes a third mirror transistor for mirroring the reference current to adjust the output current.

A source driver of a display panel is provided in the invention, wherein the display panel has a plurality of data lines. The source driver includes a first and a second output buffers, and a first switch through a fourth switches. A first input terminal and an output terminal of the first output buffer are coupled together, and a second input terminal of the first output buffer receives a first pixel signal with a first polarity. A first input terminal and an output terminal of the second output buffer are coupled together, and a second input terminal of the second output buffer receives a second pixel signal with a second polarity. A first terminal and a second terminal of the first switch are respectively coupled to the output terminal of the first output buffer and one of the data lines. A first terminal and a second terminal of the second switch are respectively coupled to the output terminal of the first output buffer and the data line neighboring to the one of the data lines. A control terminal of the first switch and a control terminal of the second switch receive a control signal and an inverted control signal, respectively. A first terminal and a second terminal of the third switch are respectively coupled to the output terminal of the second output buffer and the one of the data lines. A first terminal and a second terminal of the fourth switch are respectively coupled to the output terminal of the second output buffer, and the data line neighboring to the one of the data lines. A control terminal of the third switch and a control terminal of the fourth switch receive the inverted control signal and the control signal, respectively.

The present invention provides an output buffer that utilizes the feedback module to adjust the bias current of the bias current source according to the signal variation of the first and the second input terminals of the output buffer, so as to control the first and the second currents derived from the bias current. Besides, the feedback module also adjusts the output current of the output buffer according to the first current. Therefore, the speeds of switching the output voltage to be low level and high level can be increased by the operation of the feedback module so that the output buffer can quickly enhance the signal for driving.

Furthermore, the present invention also provides the source driver that utilizes two output buffers to perform polarity inversion on display panel. Cooperating with the first through the fourth switches, the first and the second pixel signal, which have different polarities, can be alternately provided to the data line of the display panel. Since each of the output buffers in the source driver is responsible for enhancing the pixel signal with individual polarity, the voltage swing of each output buffer can be decreased for saving the power consumption.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
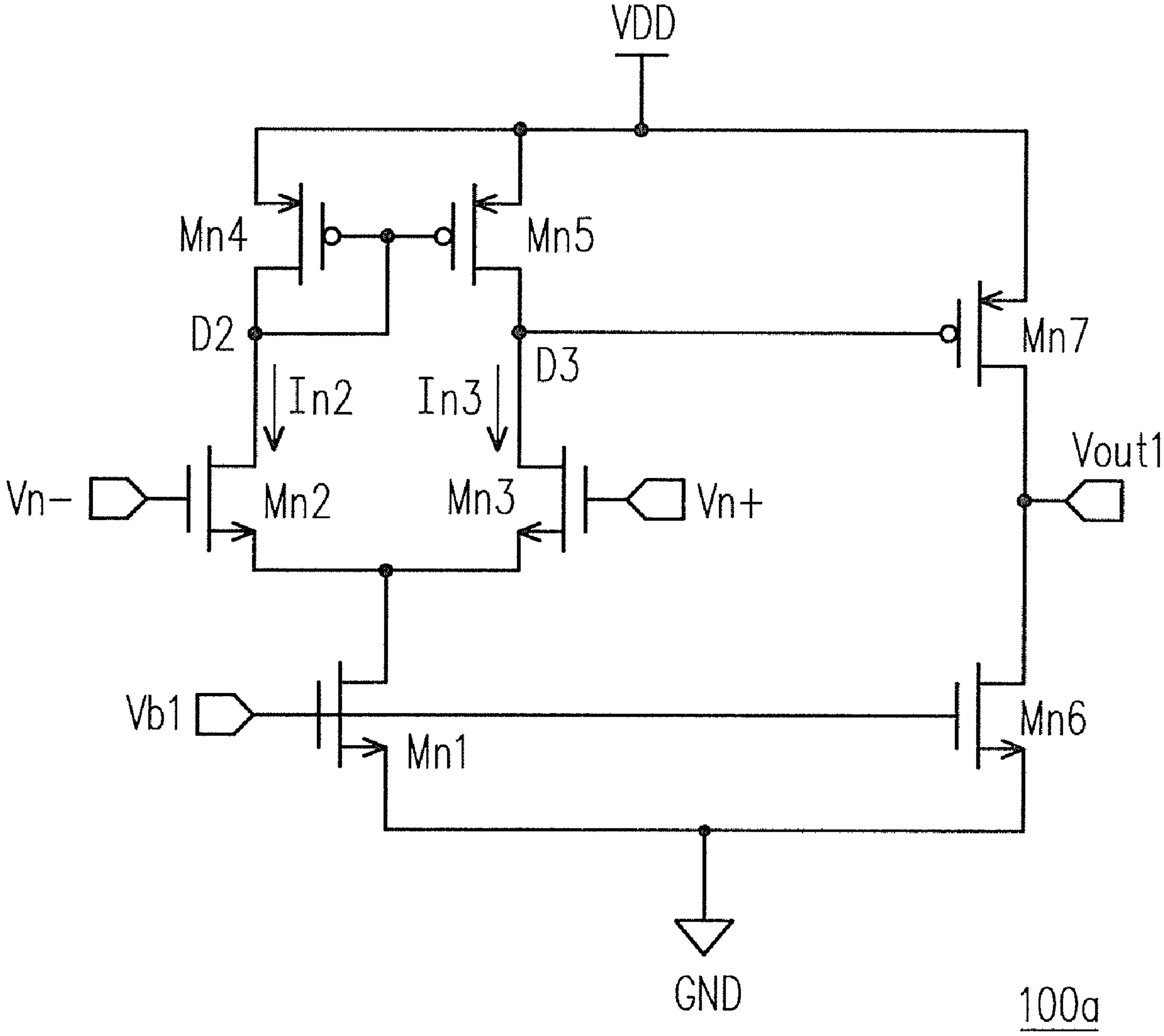
FIG. 1A(PRIOR ART)
FIG. 1A is a circuit diagram of a conventional output buffer.
Figure 1B:
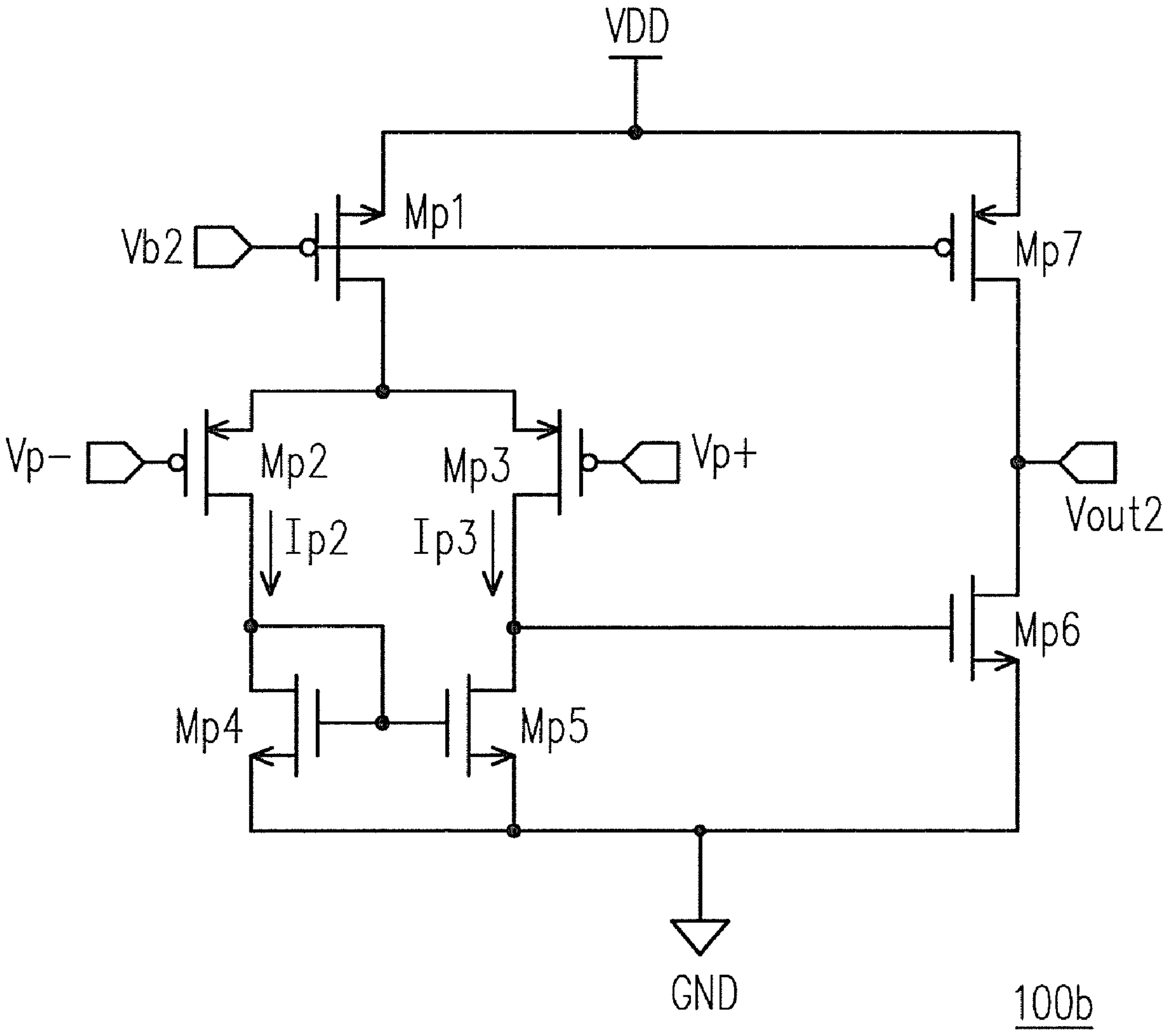
FIG. 1B(PRIOR ART)
FIG. 1B is another circuit diagram of a conventional output buffer.
Figure 2A:
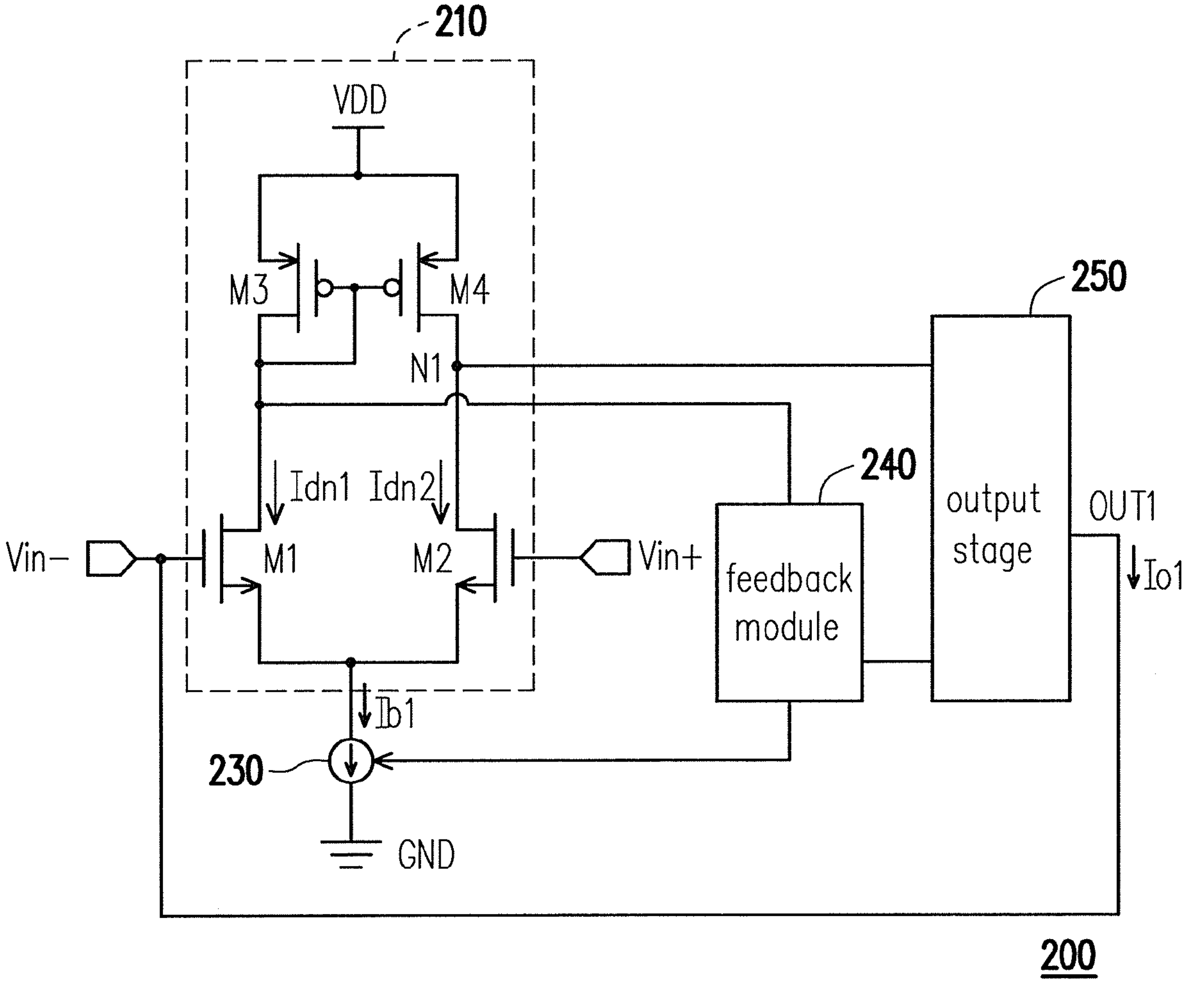
FIG. 2A is a circuit diagram of an output buffer according to an embodiment of the invention.

FIG. 2A is a diagram of an output buffer according to an embodiment of the invention. Referring to FIG. 2A, the output buffer 200 includes a differential input stage 210, a bias current source 230, a feedback module 240, and an output stage 250. The differential input stage 210 includes transistors M1 through M4, wherein in the embodiment, the transistors M1 and M2 are N-type transistors for composing N-type differential input pair, and the transistors M3 and M4 are P-type transistors. The differential input stage 210 has a first input terminal Vin− and a second input terminal Vin+ respectively receiving a first input signal and a second input signal, and has an output terminal N1. The bias current source 230 is coupled to the differential input stage 210 for providing a bias current Ib1 to the differential input stage 210 so that the differential input stage 210 can induce a first current Idn1 and a second current Idn2 based on the first input signal and the second input signal, wherein a sum of the first current Idn1 and the second current Idn2 is nearly equal to the bias current Ib1.

The output stage 250 has an output terminal OUT1 coupled to the first input terminal Vin−. The output stage 250 provides an output current Io1 via the output terminal OUT1 based on a signal of the output terminal N1 of the differential input stage 210. The feedback module 240 is coupled between the differential input stage 210 and the output stage 250. The feedback module 240 adjusts the bias current Ib1 and the output current Io1 according to the first current Idn1, wherein amount of the first current Idn1 is determined based on the first input signal and the second input signal. The following describes the operation of the output buffer 200 in detail.

Figure 2B:
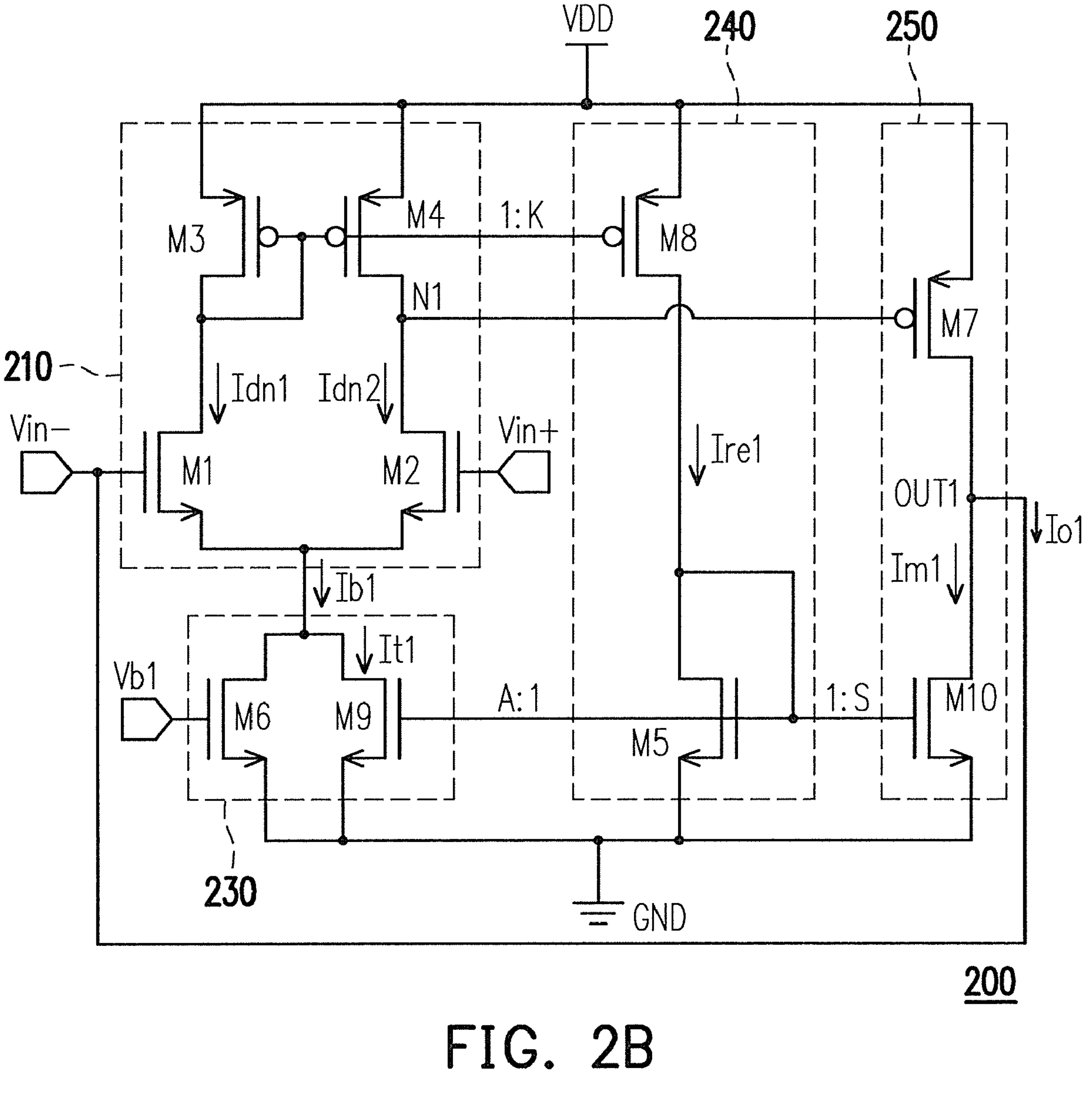
FIG. 2B is a circuit diagram of the output buffer 200 according to the embodiment in FIG. 2A.

FIG. 2B is a circuit diagram of the output buffer 200 according to the embodiment in FIG. 2A. Referring to FIG. 2A and FIG. 2B, the differential input stage 210 includes the transistors M1 through M4. The transistor M1 has a gate serving as the first input terminal Vin−, a first source/drain inducing the first current Idn1, and a second source/drain coupled to the bias current source 230. The transistor M2 has a gate serving as the second input terminal Vin+, a first source/drain inducing the second current Idn2, and a second source/drain coupled to the second source/drain of the transistor M1. The transistor M3 has a gate coupled to the first source/drain of the transistor M1, a first source/drain coupled to a power voltage VDD, and a second source/drain coupled to the gate of the transistor M3. The transistor M4 has a gate coupled to the gate of the transistor M3, a first source/drain coupled to the power voltage VDD, and a second source/drain coupled to the first source/drain of the transistor M2. The bias current Ib1 provided by the bias current source 230 drives a circuit composed of the transistors M3 and M4 so that the first current Idn1 and the second current Idn2 are induced in the differential input stage 210 based on the first input signal and the second input signal.

The feedback module 240 includes a transistor M5 and a mirror transistor M8, wherein the transistor M5 is N-type transistor, and the mirror transistor M8 is P-type transistor. The mirror transistor M8 has a gate coupled to the gate of the transistor M3, a first source/drain coupled to the power voltage VDD, and a second source/drain. The minor transistor M8 can mirror the first current Idn1 to generate a reference current Ire1 via the second source/drain of the mirror transistor M8 since a circuit composed of the mirror transistor M8 and the transistor M3 is a mirror circuit structure. The transistor M5 has a gate coupled to a first source/drain of the transistor M5 for receiving the reference current Ire1, and a second source/drain coupled to a ground voltage GND. By designing the width-to-length ratios of the transistor M3 and the mirror transistor M8, the reference current Ire1 can be adjusted. In the embodiment, the feedback module 240 adjusts the reference current Ire1 based on the first current Idn1, and thereby adjusts the bias current Ib1 of the bias current source 230 and the output current Io1 of the output stage 250 (it will be described later).

The bias current source 230 includes a transistor M6 and a mirror transistor M9, wherein the transistor M6 and the mirror transistor M9 are N-type transistors. The mirror transistor M9 has a gate coupled to the gate of the transistor M5, a first source/drain coupled to the second source/drain of the transistor M1, and a second source/drain coupled to the ground voltage GND. The mirror transistor M9 can mirror the reference current Ire1 to generate a tail current It1 for adjusting the bias current Ib1 since a circuit composed of the mirror transistor M9 and the transistor M5 is a mirror circuit structure. The transistor M6 has a gate coupled to a bias voltage Vb1, a first source/drain coupled to the second source/drain of the transistor M1, and a second source/drain coupled to the ground voltage GND. By designing the width-to-length ratios of the transistor M5 and the mirror transistor M9, the bias current Ib1 can be adjusted.

The output stage module 250 includes a transistor M7 and a mirror transistor M10, wherein the transistor M7 is P-type transistor and the mirror transistor M10 is N-type transistor. The transistor M7 has a gate coupled to the output terminal N1 of the differential input stage 210, a first source/drain coupled to the power voltage VDD, and a second source/drain serving as the output terminal OUT1 of the output stage 250. The mirror transistor M10 has a gate coupled to the gate of the transistor M5, a first source/drain coupled to the output terminal OUT1, and a second source/drain coupled to the ground voltage GND. The mirror transistor M10 can mirror the reference current Ire1 to generate a mirror current Im1 for adjusting the output current Io1 since a circuit composed of the transistor M5 and the mirror transistor M10 is a mirror circuit structure. The mirror current Im1 can be adjusted by designing the width-to-length ratios of the transistor M5 and the mirror transistor M10.

In the embodiment, it is assumed that the width-to-length ratio of the mirror transistor M8 is greater than the width-to-length ratio of the transistor M3 by K times. The width-to-length ratios of the mirror transistor M9 and M10 are greater than the width-to-length ratios of the transistor M5 by A times and S times respectively. When the signal of the second input terminal Vin+ (i.e. the second input signal) is greater than the signal of the first input terminal Vin− (i.e. the first input signal), the second current Idn2 is greater than the first current Idn1. In the meanwhile, the voltage of the output terminal N1 is decreased to conduct the transistor M7, which is an offset voltage produced by the second current Idn2 flowing through the transistor M4. The conducted transistor M7 develops a charging path to increase the output voltage of the output terminal OUT1 until the signals of the first and the second input terminal Vin− and Vin+ are equal. Accordingly, the output stage 250 can provide the output current Io1 via the output terminal OUT1 according to the signal of the output terminal N1.

When the signal of the second input terminal Vin+ (i.e. the second input signal) is less than the signal of the first input terminal Vin− (i.e. the first input signal), the second current Idn2 is less than the first current Idn1. In the meanwhile, the feedback module 240 is activated by the increase of the first current Idn1 so that the reference current Ire1 is generated by mirroring K times the first current Idn1 according to the said assumption. Besides, the tail current It1 is generated by mirroring A times the reference current Ire1. Since the sum of the first current Idn1 and the second current Idn2 is equal to the bias current Ib1 provided by the bias current source 230, the first current Idn1 is then greatly increased due to the increased tail current It1; while the first current Idn1 is increased, the reference current Ire1 and the tail current It1 are therefore increased all the more, such that a positive feedback loop is formed. The mirror current Im1 generated by mirroring S times the reference current Ire1 is the discharging current flowing through the mirror transistor M10. The mirror current Im1 is also greatly increased due to the increased reference current Ire1. Therefore, the output voltage of the output terminal OUT1 can be quickly decreased, and so does the signal of the first input terminal Vin− since the output terminal OUT1 is coupled to the first input terminal Vin−.

It is noted that although the feedback module 240 forms a positive feedback circuit to increase the discharging current while the signal of the second input terminal Vin+ is less than the signal of the first input terminal Vin−, and to make the output buffer 200 provide great discharging capability, the discharging current will not be unrestrictedly increased. The output buffer 200 is a unit gain buffer with the first input terminal Vin− connecting to the output terminal OUT1, and thus, at the discharging stage, the decreased output voltage of the output terminal OUT1 will gradually decrease the first current Idn1 till the signal of the second input terminal Vin+ is equal to the signal of the first input terminal Vin−, so as to inactivate the feedback module 240. In the embodiment of FIG. 2B, the speeds of switching the output voltage of the output terminal OUT1 to a higher level or a lower level can be quickened since the charging current and the discharging current of the output stage 250 are large.

Figure 3:
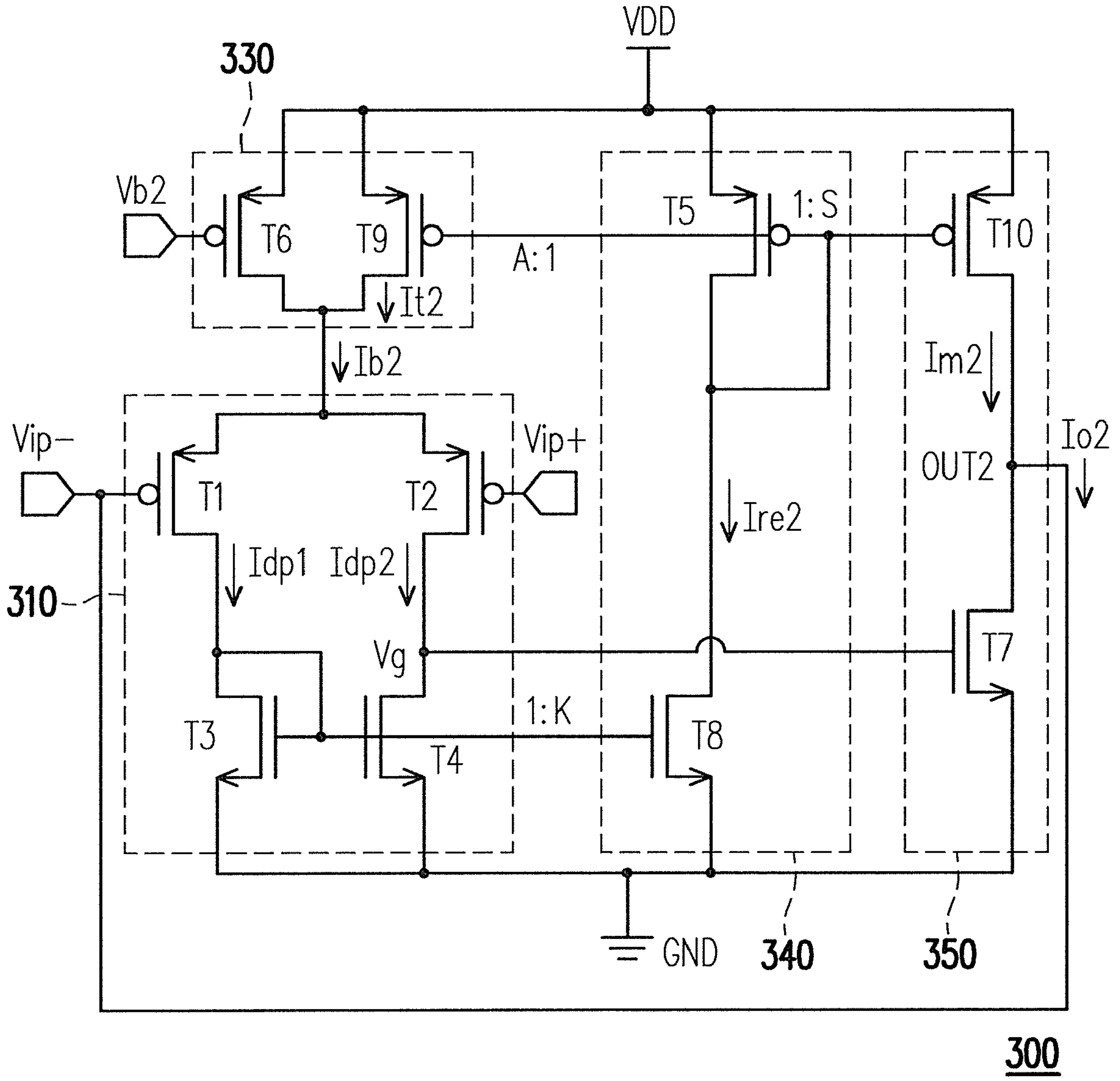
FIG. 3 is a circuit diagram of an output buffer according to another embodiment of the present invention.

FIG. 3 is a circuit diagram of an output buffer according to another embodiment of the present invention. Referring to FIG. 2B and FIG. 3, the difference between the embodiments in FIG. 2B and FIG. 3 is that the differential input stage 310 includes the transistors T1 through T4, wherein the transistors T1 and T2 are P-type transistors for composing P-type differential input pair, and the transistors T3 and T4 are N-type transistors. The bias current source 330 provides a bias current Ib2 to the differential input stage 310 so that a first current Idp1 and a second current Idp2 are induced in the differential input stage 310 based on the signals of the first input terminal Vip− and the second input terminal Vip+.

The feedback module 340 includes a P-type transistor T5 and an N-type mirror transistor T8. The mirror transistor T8 mirrors the first current Idp1 to generate the reference current Ire2. The bias current source 330 includes a P-type transistor T6 and a mirror transistor T9. The mirror transistor T9 can mirror the reference current Ire2 for adjusting the bias current Ib2. The output stage 350 includes an N-type transistor T7 and a P-type mirror transistor T10. The mirror transistor T10 can mirror the reference current Ire2 for adjusting the output current Io2. The connection between the transistors T1 through T10 in FIG. 3 is similar to the connection between the transistors M1 through M10 in FIG. 2B so that the detail is not reiterated.

When the signal of the second input terminal Vip+ is less than the signal of the first input terminal Vip−, the second current Idp2 is greater than the first current Idp1 so that the gate voltage Vg is increased to conduct the transistor T7 of the output stage 350. The discharging path is developed by the conducted transistor T7 to pull low the output voltage of the output terminal OUT2.

When the signal of the second input terminal Vip+ is greater than the signal of the first input terminal Vip−, the first current Idp1 is greater than the second current Idp2, so as to activate the feedback module 340 to form a positive feedback loop for generating the reference current Ire2, and in turn increasing the tail current It2 and then the second current Idp2, such that the mirror current Im2 flowing through the transistor T8, or namely a charging current, is greatly increased. Therefore, the output voltage of the output terminal OUT2 is increased as the mirror current Im2 increases.

Figure 4A:
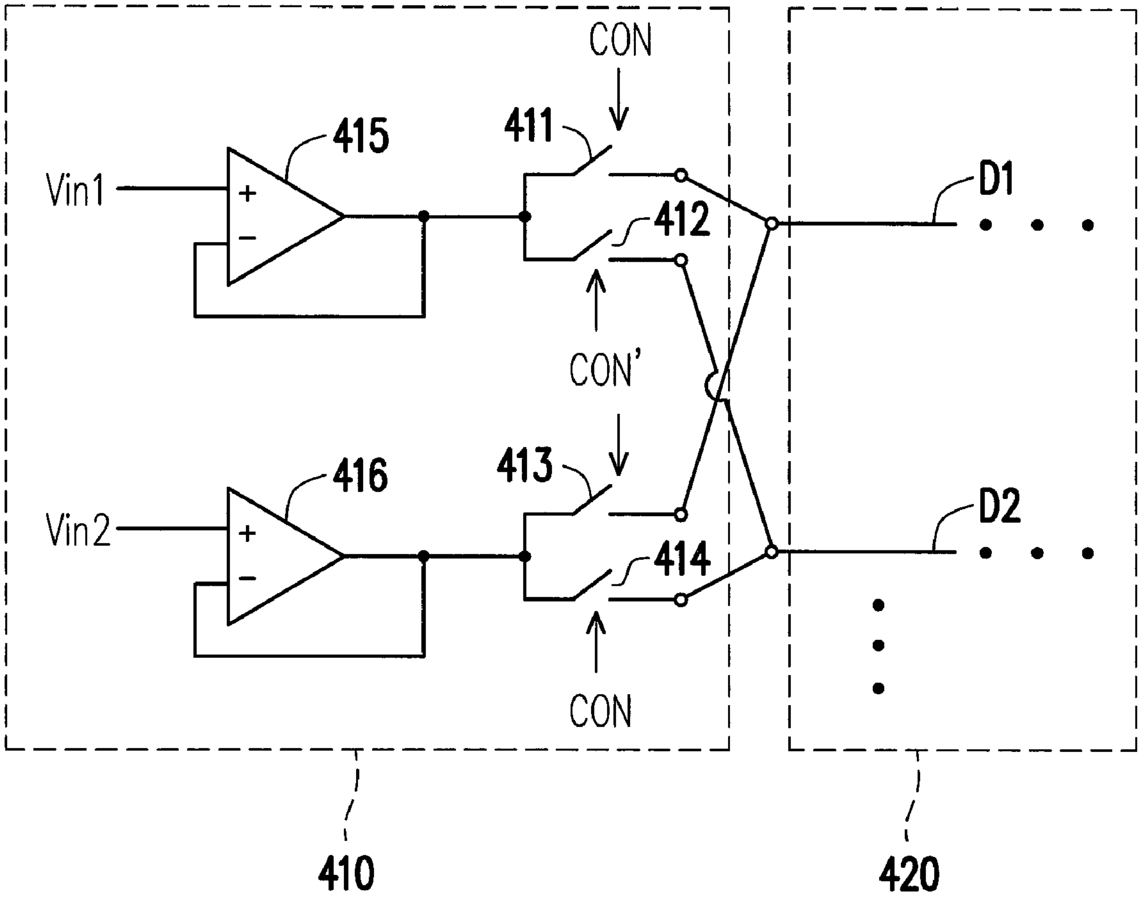
FIG. 4A is a schematic diagram of a source driver according to an embodiment of the invention.

The said two kinds of output buffers in FIG. 2B and FIG. 3 can be applied to a source driver for enhancing the driving ability of the pixel signal and performing polarity inversion on display panel. FIG. 4A is a schematic diagram of a display device according to an embodiment of the invention. The display device includes the source driver 410 and a display panel 420. The source driver 410 includes the output buffers 415 and 416, and the switches 411 through 413, to drives the data lines D1, D2, and etc. of the display panel 410. The output buffer 415 has a first input terminal (e.g. non-inverse terminal) receiving a pixel signal Vin1 with a first polarity (e.g. positive polarity), and the output buffer 415 has a second input terminal (e.g. inverse terminal) coupled to an output terminal thereof. The output buffer 416 has a first input terminal (e.g. non-inverse terminal) receiving a pixel signal Vin2 with a second polarity (e.g. negative polarity), and the output buffer 416 has a second input terminal (e.g. inverse terminal) coupled to an output terminal thereof.

For a liquid crystal display panel, positive and negative polarities are determined by the electric field direction of the liquid crystal layer. The liquid crystal layer is coupled between a pixel electrode and a common voltage VCOM, wherein the pixel electrode voltage is changed as the pixel signal. If the pixel signal is greater than the common voltage VCOM, the pixel signal is positive polarity. Otherwise, the pixel signal is negative polarity. In the embodiment, the pixel signal Vin1 is between the power voltage VDDA and the common voltage VCOM and the pixel signal Vin2 is between the ground voltage GND and the common voltage VCOM. The output buffers 415 and 416 can be implemented any one of the output buffer 200 in FIG. 2B and the output buffer 300 in FIG. 3 or the combination of them. Therefore, when polarity inversion is performed on the display panel 420, each of the output buffers 415 and 416 can rapidly changing the output terminal voltage from low level to high level or from high level to low level. In one preferred embodiment of the present invention, the output buffer 415 used for enhancing the pixel signal Vin1 with positive polarity is implemented by the output buffer 300 in FIG. 3 and the output buffer 416 used for enhancing the pixel signal Vin2 with negative polarity is implemented by the output buffer 200 in FIG. 2B.

The switch 411 has a first terminal and a second terminal respectively coupled to the output terminal of the output buffer 415 and one of the data lines, e.g. data line D1. The switch 412 has a first terminal and a second terminal respectively coupled to the output terminal of the output buffer 415 and a neighboring data line, e.g. the data line D2. The switch 413 has a first terminal and a second terminal respectively coupled to the output terminal of the output buffer 416 and the data line D1. The switch 414 has a first terminal and a second terminal respectively coupled to the output terminal of the output buffer 416 and the neighboring data line D2. The control terminals of the switches 411 and 414 receive a control signal CON and the control terminals of the switches 412 and 413 receive an inverted control signal CON'.

Figure 4B:
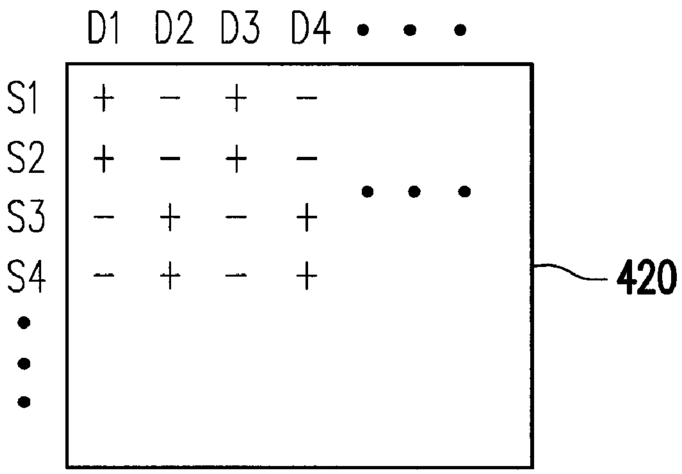
FIG. 4B is a schematic diagram of polarity invention according the embodiment in FIG. 4A.

FIG. 4B is a schematic diagram of two-dot line polarity inversion according the embodiment in FIG. 4A. Referring to FIG. 4A and FIG. 4B and taking the data lines D1 and D2 as an example, in a first scan period S1 and a second scan period S2 of a frame period, the switches 411 and 414 are conducted simultaneously by the control signal CON for respectively providing the positive polarity pixel signal and the negative polarity pixel signal to the data line D1 and the data line D2. In a third scan period S3 and a fourth scan period S4 of the same frame period, the switches 412 and 413 are conducted simultaneously by the inverted control signal CON for providing the negative polarity pixel signal and the positive pixel signal Vin2 with negative polarity to the data line D1 and the data line D2. The driving capability of the source driver 410 can be great in this example, since the output buffer 415 and the output buffer 416 both have great charging and discharging capability.

The output buffer 415 is responsible for enhancing the pixel signal Vin1 with positive polarity so that the voltage swing range of the output buffer 415 is between the power voltage VDD and the common voltage VCOM. To reason by analogy, the output buffer 416 is responsible for enhancing the pixel signal Vin2 within the range between the ground voltage GND and the common voltage VCOM. Therefore, the power consumption can be decreased since the voltage swing range of each output buffer is decreased.

In summary, the charging and discharging capability of the output buffer are enhanced by utilizing the positive feedback loop formed by the feedback module. Besides, two output buffers can be applied to the source driver for respectively enhancing the pixel signal with positive polarity and the pixel signal with negative polarity. Therefore, the source driver not only has the advantage of rapidly driving display panel, but also can save the power consumption.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. An output buffer, comprising:

a differential input stage, having a first input terminal for receiving a first input signal, a second input terminal for receiving a second input signal, and a first output terminal;

a bias current source, coupled to the differential input stage for providing a bias current to the differential input stage;

an output stage, having a second output terminal coupled to the first input terminal for providing an output current via the second output terminal based on a signal of the first output terminal; and a feedback module, coupled between the differential input stage and the output stage for adjusting the bias current and the output current based on the first input signal and the second input signal, wherein the feedback module comprises a first mirror transistor, and a second source/drain of the first mirror transistor generates a reference current, the bias current source comprises a second mirror transistor for mirroring the reference current to adjust the bias current, and the output stage comprises a third mirror transistor for mirroring the reference current to adjust the output current, a first current and a second current are respectively induced in the differential input stage based on the first input signal and the second input signal, a sum of the first current and the second current is equal to the bias current, and the feedback module adjusts the bias current and the output current based on the first current, wherein the first mirror transistor mirrors the first current to generate the reference current, and the differential input stage comprises:

a first transistor, having a gate serving as the first input terminal, a first source/drain inducing the first current, and a second source/drain coupled to the bias current source;

a second transistor, having a gate serving as the second input terminal, a first source/drain inducing the second current, and a second source/drain coupled to the second source/drain of the first transistor;

a third transistor, having a gate coupled to the first source/drain of the first transistor, a first source/drain coupled to a first voltage, and a second source/drain coupled to the gate thereof; and a fourth transistor, having a gate coupled to the gate of the third transistor, a first source/drain coupled to the first voltage, and a second source/drain coupled to the first source/drain of the second transistor.

2. The output buffer as claimed in claim 1, wherein the feedback module further comprises:

a fifth transistor, having a gate coupled to both of a gate of the second mirror transistor and a gate of the third mirror transistor, a first source/drain coupled to the gate thereof for receiving the reference current, and a second source/drain coupled to a second voltage;

wherein the first mirror transistor has a gate coupled to the gate of the third transistor, a first source/drain coupled to the first voltage.

3. The output buffer as claimed in claim 2, wherein the bias current source further comprises:

a sixth transistor, having a gate coupled to a bias voltage, a first source/drain coupled to the second source/drain of the first transistor, and a second source/drain coupled to the second voltage;

wherein the second mirror transistor has a first source/drain coupled to the second source/drain of the first transistor, and a second source/drain coupled to the second voltage.

4. The output buffer as claimed in claim 2, wherein the output stage further comprises:

a seventh transistor, having a gate coupled to the first output terminal, a first source/drain coupled to the first voltage, and a second source/drain serving as the second output terminal;

wherein the third mirror transistor has a first source/drain coupled to the second output terminal, and a second source/drain coupled to the second voltage.

5. A source driver for a display panel, wherein the display panel has a plurality of data lines, comprising:

a first output buffer, having a first input terminal and an output terminal coupled together, a second input terminal receiving a first pixel signal with a first polarity;

a second output buffer, having a first input terminal and an output terminal coupled together, a second input terminal receiving a second pixel signal with a second polarity;

a first switch, having a control terminal receiving a control signal, a first terminal coupled to the output terminal of the first output buffer, and a second terminal coupled to one of the data lines;

a second switch, having a control terminal receiving an inverted control signal, a first terminal coupled to the output terminal of the first output buffer, and a second terminal coupled to the data line neighboring to the one of the data lines;

a third switch, having a control terminal receiving the inverted control signal, a first terminal coupled to the output terminal of the second output buffer, and a second terminal coupled to the one of the data lines; and a fourth switch, having a control terminal receiving the control signal, a first terminal coupled to the output terminal of the second output buffer, and a second terminal coupled to the data line neighboring to the one of the data lines, wherein each of the first output buffer and second output buffer comprises:

a differential input stage, having a first input terminal for receiving a first input signal, a second input terminal for receiving a second input signal, and a first output terminal;

a bias current source, coupled to the differential input stage for providing a bias current to the differential input stage;

an output stage, having a second output terminal coupled to the first input terminal for providing an output current via the second output terminal based on a signal of the first output terminal; and a feedback module, adjusting the bias current and the output current based on the first input signal and the second input signal, wherein the feedback module comprises a first mirror transistor, and a second source/drain of the first mirror transistor generates a reference current, the bias current source comprises a second mirror transistor for mirroring the reference current to adjust the bias current, and the output stage comprises a third mirror transistor for mirroring the reference current to adjust the output current, a first current and a second current are respectively induced in the differential input stage based on the first input signal and the second input signal, a sum of the first current and the second current is equal to the bias current, and the feedback module adjusts the bias current and the output current based on the first current, the first mirror transistor mirrors the first current to generate a reference current, and the differential input stage comprises:

a first transistor, having a gate serving as the first input terminal, a first source/drain inducing the first current, and a second source/drain coupled to the bias current source;

a second transistor, having a gate serving as the second input terminal, a first source/drain inducing the second current, and a second source/drain coupled to the second source/drain of the first transistor;

a third transistor, having a gate coupled to the first source/drain of the first transistor, a first source/drain coupled to a first voltage, and a second source/drain coupled to the gate thereof; and a fourth transistor, having a gate coupled to the gate of the third transistor, a first source/drain coupled to the first voltage, and a second source/drain coupled to the first source/drain of the second transistor.

6. The source driver as claimed in claim 5, wherein the feedback module further comprises:

a fifth transistor, having a gate coupled to both of a gate of the second mirror transistor and a gate of the third mirror transistor, a first source/drain coupled to the gate thereof for receiving the reference current, and a second source/drain coupled to a second voltage;

wherein the first mirror transistor has a gate coupled to the gate of the third transistor, a first source/drain coupled to the first voltage.

7. The source driver as claimed in claim 6, wherein the bias current source further comprises:

a sixth transistor, having a gate coupled to a bias voltage, a first source/drain coupled to the second source/drain of the first transistor, and a second source/drain coupled to the second voltage;

wherein the second mirror transistor has a first source/drain coupled to the second source/drain of the first transistor, and a second source/drain coupled to the second voltage.

8. The source driver as claimed in claim 6, wherein the output stage further comprises:

a seventh transistor, having a gate coupled to the first output terminal, a first source/drain coupled to the first voltage, and a second source/drain serving as the second output terminal;

wherein the third mirror transistor has a first source/drain coupled to the second output terminal, and a second source/drain coupled to the second voltage.

9. The source driver as claimed in claim 5, wherein the first transistor and the second transistor of the first output buffer are N-type transistors, and the first transistor and the second transistor of the second output buffer are P-type transistors.

10. The source driver as claimed in claim 9, wherein the first polarity is positive polarity and the second polarity is negative polarity.

11. The source driver as claimed in claim 5, wherein the control signal turns on the first switch and the fourth switch and inverted control signal turns off the second switch and the third switch during a first scan period, and the control signal turns off the first switch and the fourth switch and inverted control signal turns on the second switch and the third switch during a second scan period.

* * * * *